United States Patent
Jo et al.

(10) Patent No.: US 10,663,431 B2
(45) Date of Patent: May 26, 2020

(54) QUARTZ CRYSTAL MICROBALANCE SENSOR FOR DEPOSITION MONITORING

(71) Applicant: SAMSUNG DISPLAY CO., LTD., Yongin-si, Gyeonggi-do (KR)

(72) Inventors: Yongho Jo, Yongin-si (KR); Mokleem Ha, Yongin-si (KR)

(73) Assignee: SAMSUNG DISPLAY CO., LTD., Yongin-si, Gyeonggi-do (KR)

(*) Notice: Subject to any disclaimer, the term of this patent is extended or adjusted under 35 U.S.C. 154(b) by 235 days.

(21) Appl. No.: 15/633,206

(22) Filed: Jun. 26, 2017

(65) Prior Publication Data

US 2017/0370884 A1    Dec. 28, 2017

(30) Foreign Application Priority Data

Jun. 28, 2016 (KR) .................. 10-2016-0081163

(51) Int. Cl.
| | |
|---|---|
| *G01N 29/12* | (2006.01) |
| *G01N 29/24* | (2006.01) |
| *G01N 29/36* | (2006.01) |
| *H01L 41/047* | (2006.01) |
| *H01L 41/18* | (2006.01) |

(Continued)

(52) U.S. Cl.
CPC .......... *G01N 29/022* (2013.01); *G01N 29/12* (2013.01); *G01N 29/2443* (2013.01); *G01N 29/36* (2013.01); *H01L 41/0477* (2013.01); *H01L 41/183* (2013.01); *G01N 2291/014* (2013.01); *G01N 2291/0237* (2013.01);

(Continued)

(58) Field of Classification Search
CPC .......... G01N 29/022; G01N 2291/014; G01N 2291/0426; G01N 2291/0237; H01L 41/0477; H01L 22/12
USPC ........................................... 73/658
See application file for complete search history.

(56) References Cited

U.S. PATENT DOCUMENTS

| 5,233,261 A | 8/1993 | Wajid | |
| 5,874,039 A * | 2/1999 | Edelson | H01J 1/02 204/290.02 |

(Continued)

FOREIGN PATENT DOCUMENTS

| JP | 2006-033181 | 2/2006 |
| KR | 10-2008-0062212 | 7/2008 |
| KR | 10-2012-0110975 | 10/2012 |

*Primary Examiner* — Jacques M Saint Surin
(74) *Attorney, Agent, or Firm* — F. Chau & Associates, LLC (57) ABSTRACT

A quartz crystal microbalance (QCM) sensor includes a crystal plate, a buffer layer, and an electrode. The crystal plate has a first surface and a second surface. The second surface is opposite the first surface. The buffer layer includes a first buffer layer and a second buffer layer. The first buffer layer is disposed on the first surface of the crystal plate, the second buffer layer is disposed on the second surface of the crystal plate. The electrode includes a first electrode and a second electrode. The first electrode is disposed on the first buffer layer. The second electrode is disposed on the second buffer layer. The electrode includes at least one of titanium, scandium, beryllium, cobalt, yttrium, zirconium, technetium, ruthenium, lanthanum, cerium, praseodymium, neodymium, gadolinium, terbium, dysprosium, holmium, erbium, thulium, lutetium, hafnium, rhenium, osmium, americium, curium, berkelium, and californium.

14 Claims, 6 Drawing Sheets

(51) Int. Cl.
 G01N 29/02 (2006.01)
 H01L 21/66 (2006.01)
(52) U.S. Cl.
 CPC ............... *G01N 2291/0256* (2013.01); *G01N 2291/0426* (2013.01); *H01L 22/12* (2013.01)

(56) References Cited

U.S. PATENT DOCUMENTS

| | | | | |
|---|---|---|---|---|
| 6,750,728 | B2* | 6/2004 | Takahashi | H03H 3/04 |
| | | | | 331/154 |
| 7,036,375 | B2* | 5/2006 | Nozaki | G01G 3/13 |
| | | | | 73/24.06 |
| 7,311,777 | B2* | 12/2007 | Takahashi | C30B 25/02 |
| | | | | 117/104 |
| 8,569,936 | B2 | 10/2013 | Park | |
| 2004/0248144 | A1* | 12/2004 | Mir | C12Q 1/6818 |
| | | | | 435/6.11 |
| 2006/0107733 | A1* | 5/2006 | Aastrup | G01N 9/002 |
| | | | | 73/64.53 |
| 2009/0273882 | A1* | 11/2009 | Park | H01G 4/008 |
| | | | | 361/305 |
| 2014/0185182 | A1* | 7/2014 | Hsieh | H01G 4/10 |
| | | | | 361/301.4 |
| 2016/0187358 | A1* | 6/2016 | Tanaka | G01N 33/4905 |
| | | | | 435/13 |
| 2017/0288122 | A1* | 10/2017 | Zou | H03H 9/02102 |

\* cited by examiner

QUARTZ CRYSTAL MICROBALANCE SENSOR FOR DEPOSITION MONITORING

CROSS-REFERENCE TO RELATED APPLICATION

This application claims priority under 35 U.S.C. § 119 to Korean Patent Application No. 10-2016-0081163, filed on Jun. 28, 2016 in the Korean Intellectual Property Office, the disclosure of which is incorporated by reference herein in its entirety.

TECHNICAL FIELD

Exemplary embodiments of the present invention relate to a quartz crystal microbalance sensor for deposition monitoring.

DISCUSSION OF RELATED ART

Display apparatuses may be used in mobile apparatuses such as smartphones, laptop computers, digital cameras, camcorders, portable information terminals, notebooks, and tablet personal computers (PCs). Display apparatuses may also be used in electronic devices such as desktop computers, televisions, outdoor billboards, exhibition display devices, dashboards, and head-up displays (HUDs).

Examples of display apparatuses may include organic light-emitting display devices (OLEDs), liquid crystal displays (LCDs), field emission displays (FEDs), and electronic paper displays (EDPs).

In such display apparatuses, a plurality of thin films may be formed on a substrate. The thin films may be formed by various methods. For example, a deposition method may be used to deposit a deposition material on a substrate by using a mask. The mask may have substantially the same pattern as a pattern of a thin film to be deposited. In order to form a deposition film having a substantially uniform thickness, an amount of a deposition material deposited thereon may be measured.

SUMMARY

One or more exemplary embodiments of the present invention provide a quartz crystal microbalance sensor for deposition monitoring, which may used to form a deposition film having a substantially uniform thickness.

One or more exemplary embodiment of the present invention provide a quartz crystal microbalance (QCM) sensor. The QCM sensor includes a crystal plate, a buffer layer, and an electrode. The crystal plate has a first surface and a second surface. The second surface is opposite the first surface. The buffer layer includes a first buffer layer and a second buffer layer. The first buffer layer is disposed on the first surface of the crystal plate. The second buffer layer is disposed on the second surface of the crystal plate. The electrode includes a first electrode and a second electrode. The first electrode is disposed on the first buffer layer. The second electrode is disposed on the second buffer layer. The electrode includes at least one of titanium, scandium, beryllium, cobalt, yttrium, zirconium, technetium, ruthenium, lanthanum, cerium, praseodymium, neodymium, gadolinium, terbium, dysprosium, holmium, erbium, thulium, lutetium, hafnium, rhenium, osmium, americium, curium, berkelium, and californium.

The electrode may include a metal having a hexagonal close-packed lattice (HCP) crystal structure.

The electrode may be disposed on an outermost surface of the QCM sensor.

The buffer layer may include aluminum, silver, or gold.

An electrical activity of the buffer layer may be higher than an electrical activity of the electrode.

A total resistance of the QCM sensor may be about 15Ω or less.

A thickness ratio of the buffer layer to the electrode may be changed in a range of about 60% to about 90%.

The electrode may have a single-layered structure.

The electrode may have a multi-layered structure.

The first buffer layer may be in direct contact with the first surface of the crystal plate. The second buffer layer may be in direct contact with the second surface of the crystal plate. The first electrode may be in direct contact with the first buffer layer. The second electrode may be in direct contact with the second buffer layer.

The QCM sensor may further include at least one adhesive layer disposed on the crystal plate.

A first adhesive layer may be disposed on the first surface of the crystal plate. A second adhesive layer may be disposed on the second surface of the crystal plate. The first buffer layer may be disposed on the first adhesive layer. The second buffer layer may be disposed on the second adhesive layer. The first electrode may be disposed on the first buffer layer. The second electrode may be disposed on the second buffer layer.

The first buffer layer may be disposed on the first surface of the crystal plate. The second buffer layer may be disposed on the second surface of the crystal plate. A first adhesive layer may be disposed on the first buffer layer. A second adhesive layer may be disposed on the second buffer layer. The first electrode may be disposed on the first buffer layer. The second electrode may be disposed on the second buffer layer.

A first adhesive layer may be disposed on the first surface of the crystal plate. A second adhesive layer may be disposed on the second surface of the crystal plate. The first buffer layer may be disposed on the first adhesive layer. The second buffer layer may be disposed on the second adhesive layer. A third adhesive layer may be disposed on the first buffer layer. A fourth adhesive layer may be disposed on the second buffer layer. The first electrode may be disposed on the third adhesive layer. The second electrode may be disposed on the fourth adhesive layer.

The adhesive layer may include a metal having a hexagonal close-packed lattice (HCP) crystal structure.

One or more embodiments provide a quartz crystal microbalance (QCM) sensor. The QCM sensor includes a crystal plate, a buffer layer, and an electrode. The crystal plate has a first surface and a second surface. The second surface is opposite the first surface. The buffer layer includes a first buffer layer and a second buffer layer. The first buffer layer is disposed on the first surface of the crystal plate. The second buffer layer is disposed on the second surface of the crystal plate. The electrode includes a first electrode and a second electrode. The first electrode is disposed on the first buffer layer. The second electrode is disposed on the second buffer layer. The electrode includes a metal having a hexagonal close-packed lattice (HCP) crystal structure.

The electrode may include at least one of titanium, scandium, beryllium, cobalt, yttrium, zirconium, technetium, ruthenium, lanthanum, cerium, praseodymium, neodymium, gadolinium, terbium, dysprosium, holmium, erbium, thulium, lutetium, hafnium, rhenium, osmium, americium, curium, berkelium, and californium.

The electrode may be disposed on an outermost surface of the QCM sensor.

The buffer layer may include aluminum, silver, or gold.

The QCM sensor may further include at least one adhesive layer disposed on the crystal plate. The adhesive layer may include a metal having a HCP crystal structure.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

It will be understood that when a component, such as a layer, a film, a region, or a plate, is referred to as being "on" another component, the component can be directly on the other component or intervening components may be present.

It is to be understood that while parameters may be described herein as having "about" a certain value, according to exemplary embodiments, the parameter may be exactly the certain value or approximately the certain value as would be understood by a person having ordinary skill in the art.

In the following examples, the x-axis, the y-axis and the z-axis are not limited to three axes of the rectangular coordinate system, and may be interpreted in a broader sense. For example, the x-axis, the y-axis, and the z-axis may be substantially perpendicular to one another, or may represent different directions that are not substantially perpendicular to one another.

A deposition apparatus according to one or more exemplary embodiments of the present invention will be described in more detail below with reference to the accompanying drawings.

Figure 1:
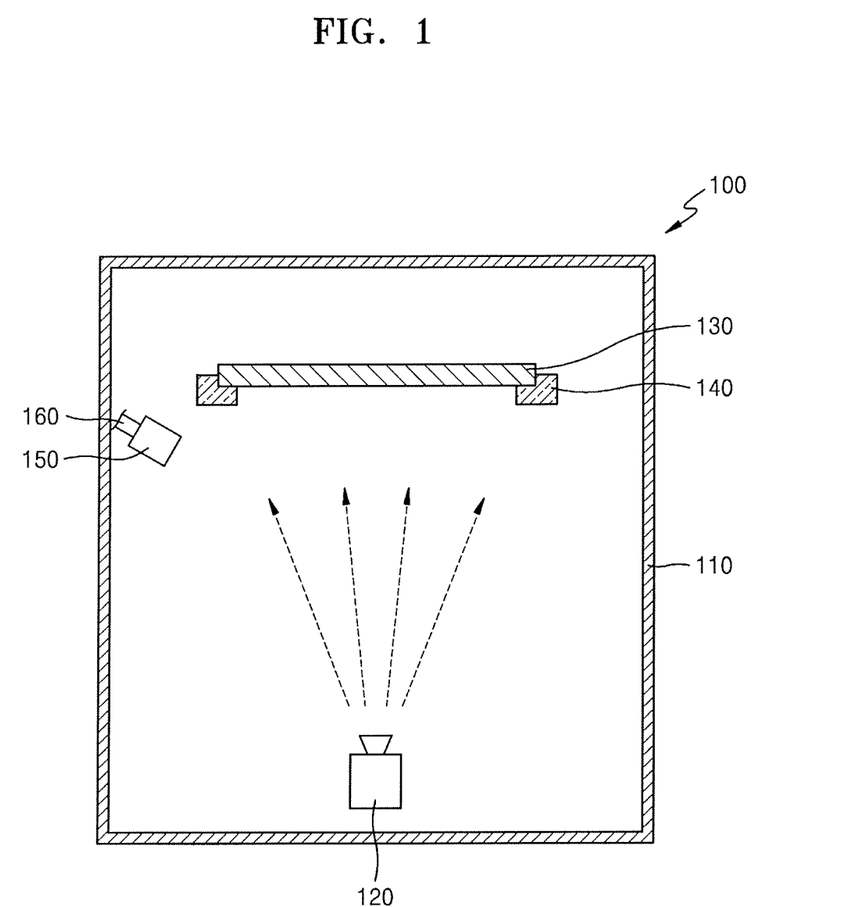
FIG. 1 is a schematic configuration diagram illustrating a deposition apparatus including a quartz crystal microbalance (QCM) sensor according to an exemplary embodiment of the present invention.

FIG. 1 is a schematic configuration diagram illustrating a deposition apparatus including a quartz crystal microbalance sensor according to an exemplary embodiment of the present invention.

Referring to FIG. 1, a deposition apparatus 100 may include a vacuum chamber 110. An electrode of an organic light-emitting device may be deposited in the vacuum chamber 110. However, the deposition apparatus 100 is not limited thereto. For example, an apparatus configured to deposit a thin film of a display apparatus, for example, a metal or an organic material, therein may be used.

The deposition apparatus 100 may include a deposition source 120. The deposition source 120 may be disposed in a lower portion of the vacuum chamber 110. A substrate 130 may be disposed above the deposition source 120. A deposition material may be deposited on the substrate 130. The substrate 130 may be supported by a substrate holder 140.

A quartz crystal microbalance (QCM) sensor 150 may be disposed on one side of the vacuum chamber 110. The QCM sensor 150 may be configured to measure, for example, in real time, an amount of a deposition material emitted from the deposition source 120 toward the substrate 130. The QCM sensor 150 may be supported by a support 160.

The deposition material emitted from the deposition source 120 may be deposited on the substrate 130. At substantially the same time, the deposition material emitted from the deposition source 120 may also be deposited on the QCM sensor 150. The deposition material may contact the QCM sensor 150. The QCM sensor 150 may sense contact with the deposition material, and may measure an amount of the deposition material deposited thereon.

The deposition apparatus 100 may include a plurality of QCM sensors 150. For example, at least one of the QCM sensors 150 may measure an amount of a deposition material deposited on the substrate 130. After the QCM sensor 150 is used for a predetermined amount of time, the QCM sensor 150 may be replaced with another QCM sensor 150.

Figure 2:
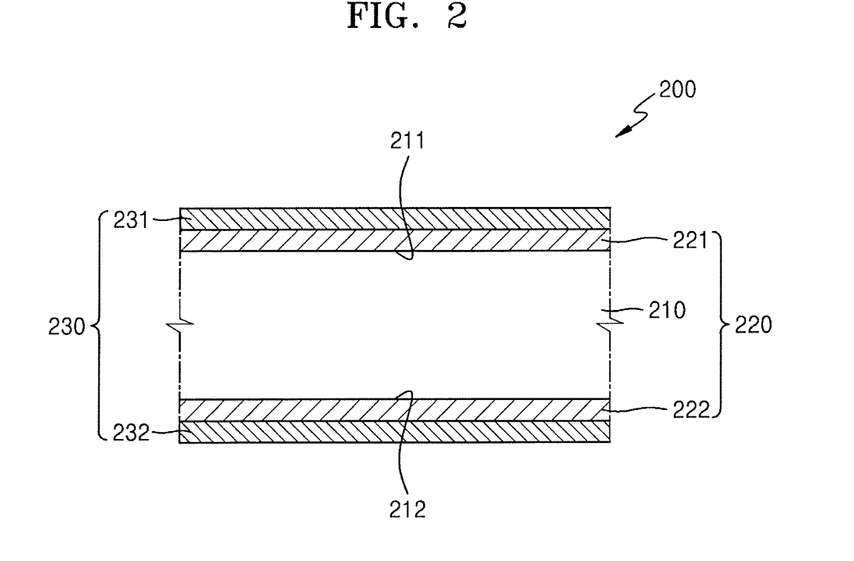
FIG. 2 is a cross-sectional view illustrating a QCM sensor according to an exemplary embodiment of the present invention.

FIG. 2 is a cross-sectional view illustrating a QCM sensor according to an exemplary embodiment of the present invention.

Referring to FIG. 2, a QCM sensor 200 may include a crystal plate 210, a buffer layer 220, and an electrode 230. The crystal plate 210 may vibrate, for example, in response to an electrical signal. The buffer layer 220 may be disposed on outer surfaces of the crystal plate 210. The electrode 230 may be disposed on outer surfaces of the buffer layer 220.

The crystal plate 210 may have a first surface 211 and a second surface 212 opposite the first surface 211.

The buffer layer 220 may include a first buffer layer 221 and a second buffer layer 222. The first buffer layer 221 may be disposed on the first surface 211 of the crystal plate 210. The first buffer layer 221 may be in contact with the first surface 211 of the crystal plate 210. For example, the first buffer layer 221 may be in direct contact with the first surface 211 of the crystal plate 210. The second buffer layer 222 may be disposed on the second surface 212 of the crystal plate 210. The second buffer layer 222 may be in contact with the second surface 212 of the crystal plate 210. For example, the second buffer layer 222 may be in direct contact with the second surface 212 of the crystal plate 210.

The electrode 230 may include a first electrode 231 and a second electrode 232. The first electrode 231 may be disposed on the first buffer layer 221. The first electrode 231 may be in contact with the first buffer layer 221. For example, the first electrode 231 may be in direct contact with the first buffer layer 221. The second electrode 232 may be disposed on the second buffer layer 222. The second electrode 232 may be in contact with the second buffer layer 222. For example, the second electrode 232 may be in direct contact with the second buffer layer 222.

According to one or more exemplary embodiments of the present invention, the first electrode 231 and the second electrode 232 may each have a single-layered structure. For example, the first electrode 231 and the second electrode 232 each having a single-layered structure may be disposed on the first buffer layer 221 and the second buffer layer 222, respectively.

According to one or more exemplary embodiments of the present invention, each of the first electrode 231 and the second electrode 232 may have a multi-layered structure. For example, the first electrode 231 and the second electrode 232 may each have a structure of two or more layers. The first electrode 231 and the second electrode 232 each having a multi-layered structure may be disposed on the first buffer layer 221 and the second buffer layer 222, respectively.

The electrode 230 may include at least one of titanium (Ti), scandium (Sc), beryllium (Be), cobalt (Co), yttrium (Y), zirconium (Zr), technetium (Tc), ruthenium (Ru), lanthanum (La), cerium (Ce), praseodymium (Pr), neodymium (Nd), gadolinium (Gd), terbium (Tb), dysprosium (Dy), holmium (Ho), erbium (Er), thulium (Tm), lutetium (Lu), hafnium (Hf), rhenium (Re), osmium (Os), americium (Am), curium (Cm), berkelium (Bk), and californium (Cf). The electrode 230 may be disposed on outermost surfaces of the QCM sensor 200.

When the deposition material has a hexagonal close-packed (HCP) lattice structure such as magnesium (Mg), the electrode 230 may include a metal having substantially the same HCP lattice structure as the HCP lattice structure of the deposition material. The crystal structures of the electrode 230 may each have the HCP lattice structure. When the electrode 230 and the deposition material have substantially the same crystal structure, adhesion between the electrode 230 and the deposition material may increase. Therefore, the deposition material having the HCP crystal structure may have an increased sensing performance.

The buffer layer 220 may include a material having a higher electrical activity than an electrical activity of the electrode 230. Thus, a resistance of the QCM sensor 200 may be reduced. The buffer layer 220 may include, for example, aluminum (Al), silver (Ag), or gold (Au). Accordingly, a total resistance of the QCM sensor 200 may be about 15Ω or less.

Thicknesses of the buffer layer 220 and the electrode 230 may be variously changed. A thickness ratio of the buffer layer 220 to the electrode 230 may be changed according to a usage environment. The thickness ratio of the buffer layer 220 to the electrode 230 may be changed in a range of about 60% to about 90%. In other words, the thickness ratio of the electrode 230 to the buffer layer 220 may be changed in a range of about 10% to about 40%.

For example, the thickness ratio of the buffer layer 220 to the electrode 230 may be about 60% to about 40%. As a result, the sensing performance of the QCM sensor 200 may be increased. The thickness ratio of the buffer layer 220 to the electrode 230 may be about 90% to about 10%. As a result, the electrical activity of the QCM sensor 200 may be increased.

A method of measuring a deposited amount of a deposition material by using the QCM sensor 200 will be described in more detail below.

When an alternating current (AC) voltage is applied to the electrode 230 disposed on the outermost surfaces of the crystal plate 210, the crystal plate 210 may vibrate at a resonance frequency thereof. When the deposition material from the deposition source 120 is deposited on the electrode 230 in the vacuum chamber 110 of FIG. 1, a weight of the electrode 230 may change. The resonance frequency of the crystal plate 210 may change according to a change in the weight of the electrode 230. Thus, an amount of the deposition material deposited on the electrode 230 may be sensed in real time by sensing the change in the weight of the electrode 230.

When the deposition material is deposited on the electrode 230 of the QCM sensor 200, the resonance frequency of the crystal plate 210 may be displaced in proportion to the amount of the deposition material deposited on the electrode 230. The displacement degree of the resonance frequency may be in a range of about 5 MHz to about 6 MHz.

According to one or more exemplary embodiments of the present invention, at least one adhesive layer may be disposed on an outer surface of the crystal plate 210.

Various exemplary embodiments of the present invention in which an adhesive layer is included in a QCM sensor will be described in more detail below.

Figure 3:
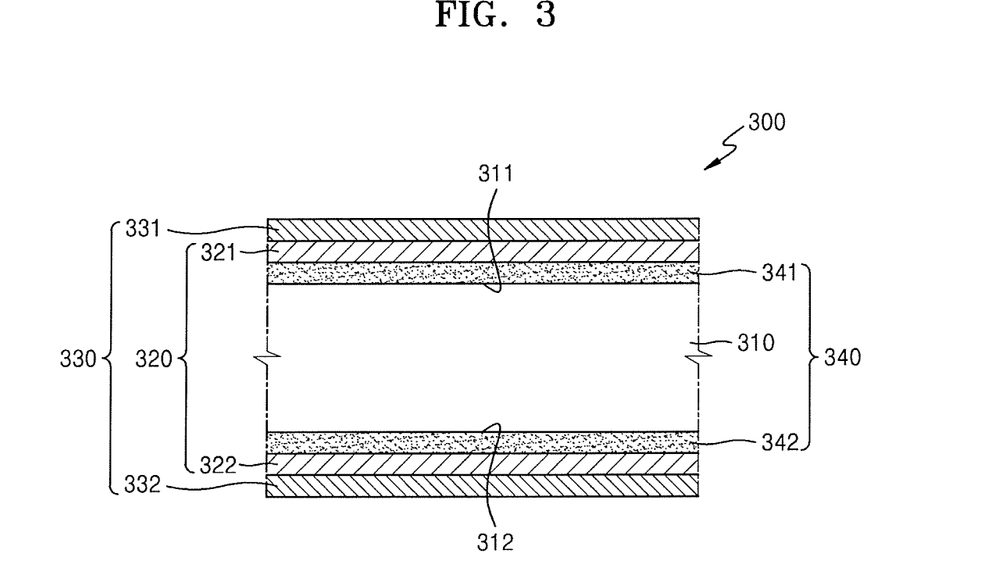
FIG. 3 is a cross-sectional view illustrating a QCM sensor according to an exemplary embodiment of the present invention.

FIG. 3 is a cross-sectional view illustrating a QCM sensor according to an exemplary embodiment of the present invention.

Referring to FIG. 3, a QCM sensor 300 may include a crystal plate 310, an adhesive layer 340, a buffer layer 320, and an electrode 330. The adhesive layer 340 may be disposed on outer surfaces of the crystal plate 310. The buffer layer 320 may be disposed on outer surfaces of the adhesive layer 340. The electrode 330 may be disposed on outer surfaces of the buffer layer 320.

The crystal plate 310 may have a first surface 311 and a second surface 312 opposite the first surface 311.

The adhesive layer 340 may include a first adhesive layer 341 and a second adhesive layer 342. The first adhesive layer 341 may be disposed on the first surface 311 of the crystal plate 310. The second adhesive layer 342 may be disposed on the second surface 312 of the crystal plate 310. The buffer layer 320 may include a first buffer layer 321 and a second buffer layer 322. The first buffer layer 321 may be disposed on the first adhesive layer 341. The second buffer layer 322 may be disposed on the second adhesive layer 342. The electrode 330 may include a first electrode 331 and a second electrode 332. The first electrode 331 may be disposed on the first buffer layer 321. The second electrode 332 may be disposed on the second buffer layer 322.

The first adhesive layer 341 may increase adhesion between the crystal plate 310 and the first buffer layer 321. The second adhesive layer 342 may increase adhesion between the crystal plate 310 and the second buffer layer 322. The adhesive layer 340 including the first adhesive layer 341 and the second adhesive layer 342 may include a metal having a HCP crystal structure.

The buffer layer 320 including the first buffer layer 321 and the second buffer layer 322 may include, for example, aluminum (Al), silver (Ag), or gold (Au).

The electrode 330 including the first electrode 331 and the second electrode 332 may be disposed on outermost surfaces of the QCM sensor 300. The electrode 330 may include, for example, titanium (Ti), scandium (Sc), beryllium (Be), cobalt (Co), yttrium (Y), zirconium (Zr), technetium (Tc), ruthenium (Ru), lanthanum (La), cerium (Ce), praseodymium (Pr), neodymium (Nd), gadolinium (Gd), terbium (Tb), dysprosium (Dy), holmium (Ho), erbium (Er), thulium (Tm), lutetium (Lu), hafnium (Hf), rhenium (Re), osmium (Os), americium (Am), curium (Cm), berkelium (Bk), or californium (Cf). The electrode 330 may include a metal having a HCP crystal structure.

Thicknesses of the buffer layer 320, the electrode 330, and the adhesive layer 340 may be variously changed. For example, a thicknesses ratio of the buffer layer 320:the electrode 330:the adhesive layer 340 may be about 30%:about 40%:about 30%. A thickness ratio of the buffer layer 320:the electrode 330:the adhesive layer 340 may be adjusted, for example, according to usage environment.

Figure 4:
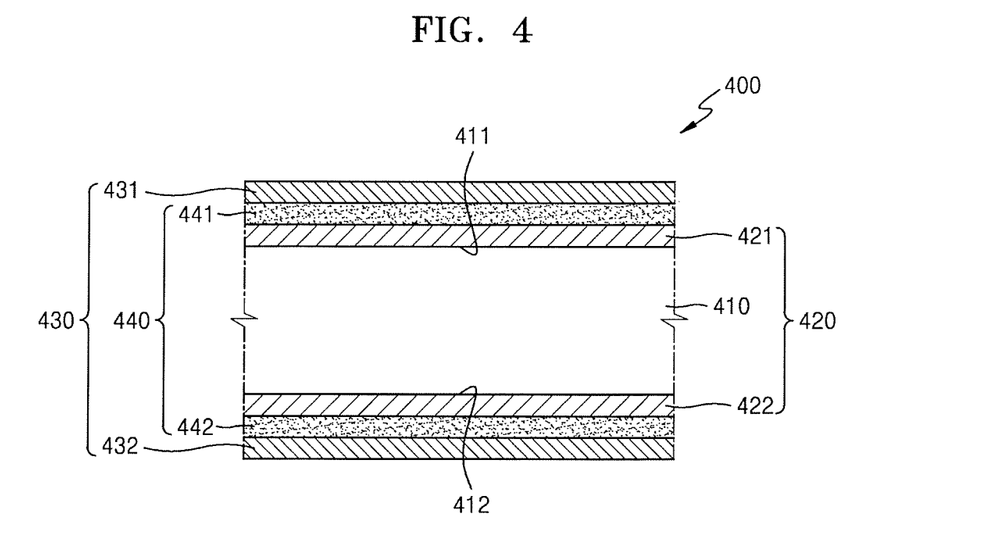
FIG. 4 is a cross-sectional view illustrating a QCM sensor according to an exemplary embodiment of the present invention.

FIG. 4 is a cross-sectional view illustrating a QCM sensor according to an exemplary embodiment of the present invention.

Referring to FIG. 4, a QCM sensor 400 may include a crystal plate 410, a buffer layer 420, an adhesive layer 440, and an electrode 430. The buffer layer 420 may be disposed on outer surfaces of the crystal plate 410. The adhesive layer 440 may be disposed at outer surfaces of the buffer layer 420. The electrode 430 may be disposed at outer surfaces of the adhesive layer 440.

The crystal plate 410 may have a first surface 411 and a second surface 412 opposite the first surface 411.

The buffer layer 420 may include a first buffer layer 421 and a second buffer layer 422. The first buffer layer 421 may be disposed on the first surface 411 of the crystal plate 410. The second buffer layer 422 may be disposed on the second surface 412 of the crystal plate 410. The adhesive layer 440 may include a first adhesive layer 441 and a second adhesive layer 442. The first adhesive layer 441 may be disposed on the first buffer layer 421. The second adhesive layer 442 may be disposed on the second buffer layer 422. The electrode 430 may include a first electrode 431 and a second electrode 432. The first electrode 431 may be disposed on the first adhesive layer 441. The second electrode 432 may be disposed on the second adhesive layer 442.

The first adhesive layer 441 may increase adhesion between the first buffer layer 421 and the first electrode 431. The second adhesive layer 442 may increase adhesion between the second buffer layer 422 and the second electrode 432. The adhesive layer 440 including the first adhesive layer 441 and the second adhesive layer 442 may include a metal having a HCP crystal structure.

The buffer layer 420 including the first buffer layer 421 and the second buffer layer 422 may include, for example, aluminum (Al), silver (Ag), or gold (Au).

The electrode 430 including the first electrode 431 and the second electrode 432 may be disposed on outermost surfaces of the QCM sensor 400. The electrode 430 may include, for example, titanium (Ti), scandium (Sc), beryllium (Be), cobalt (Co), yttrium (Y), zirconium (Zr), technetium (Tc), ruthenium (Ru), lanthanum (La), cerium (Ce), praseodymium (Pr), neodymium (Nd), gadolinium (Gd), terbium (Tb), dysprosium (Dy), holmium (Ho), erbium (Er), thulium (Tm), lutetium (Lu), hafnium (Hf), rhenium (Re), osmium (Os), americium (Am), curium (Cm), berkelium (Bk), or californium (Cf). The electrode 430 may include a metal having a HCP crystal structure.

Figure 5:
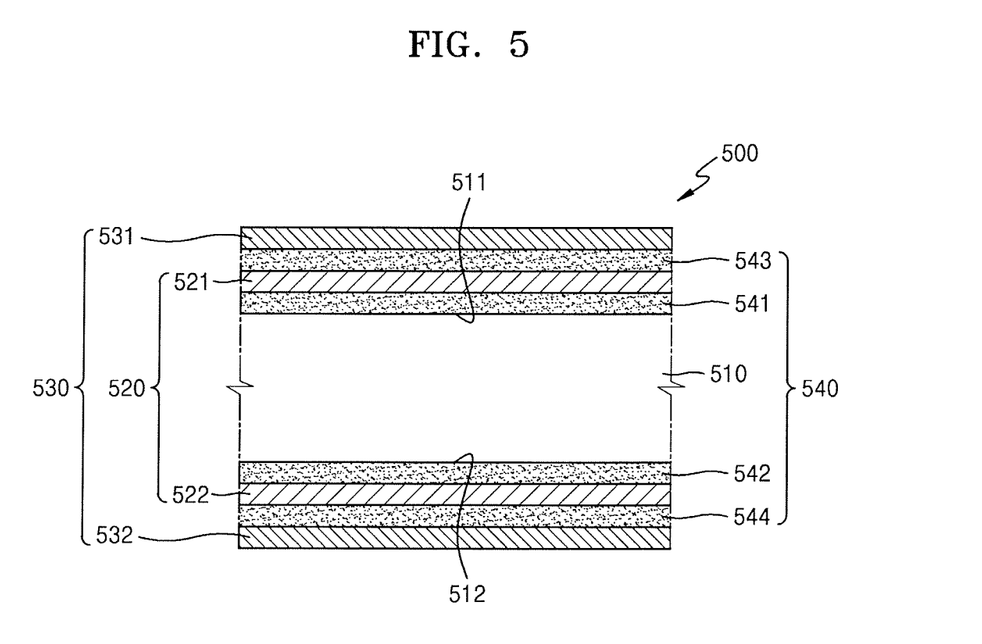
FIG. 5 is a cross-sectional view illustrating a QCM sensor according to an exemplary embodiment of the present invention.

FIG. 5 is a cross-sectional view illustrating a QCM sensor according to an exemplary embodiment of the present invention.

Referring to FIG. 5, a QCM sensor 500 may include a crystal plate 510, a buffer layer 520 an electrode 530, and an adhesive layer 540. The buffer layer 520 may be disposed on outer surfaces of the crystal plate 510. The electrode 530 may be disposed on outer surfaces of the buffer layer 520. The adhesive layer 540 may be disposed between the crystal plate 510 and the buffer layer 520. The adhesive layer 540 may also be disposed between the buffer layer 520 and the electrode 530.

The crystal plate 510 may have a first surface 511 and a second surface 512 opposite the first surface 511.

The adhesive layer 540 may include a first adhesive layer 541 and a second adhesive layer 542. The first adhesive layer 541 may be disposed on the first surface 511 of the crystal plate 510. The second adhesive layer 542 may be disposed on the second surface 512 of the crystal plate 510. The buffer layer 520 may include a first buffer layer 521 and a second buffer layer 522. The first buffer layer 521 may be disposed on the first adhesive layer 541. The second buffer layer 522 may be disposed on the second adhesive layer 542. The adhesive layer 540 may also include a third adhesive layer 543 and a fourth adhesive layer 544. The third adhesive layer 543 may be disposed on the first buffer layer 521. The fourth adhesive layer 544 may be disposed on the second buffer layer 522. The electrode 530 may include a first electrode 531 and a second electrode 532. The first electrode 531 may be disposed on the third adhesive layer 543. The second electrode 532 may be disposed on the fourth adhesive layer 544.

The first adhesive layer 541 may increase adhesion between the crystal plate 510 and the first buffer layer 521. The second adhesive layer 542 may increase adhesion between the crystal plate 510 and the second buffer layer 522. The third adhesive layer 543 may increase adhesion between the first buffer layer 521 and the first electrode 531. The fourth adhesive layer 544 may increase adhesion between the second buffer layer 522 and the second electrode 532.

The adhesive layer 540 including the first adhesive layer 541, the second adhesive layer 542, the third adhesive layer 543, and the fourth adhesive layer 544 may include a metal having a HCP crystal structure.

The buffer layer 520 including the first buffer layer 521 and the second buffer layer 522 may include, for example, aluminum (Al), silver (Ag), or gold (Au).

The electrode 530 including the first electrode 531 and the second electrode 532 may be disposed on outermost surfaces of the QCM sensor 500. The electrode 530 may include, for example, titanium (Ti), scandium (Sc), beryllium (Be), cobalt (Co), yttrium (Y), zirconium (Zr), technetium (Tc), ruthenium (Ru), lanthanum (La), cerium (Ce), praseodymium (Pr), neodymium (Nd), gadolinium (Gd), terbium (Tb), dysprosium (Dy), holmium (Ho), erbium (Er), thulium (Tm), lutetium (Lu), hafnium (Hf), rhenium (Re), osmium (Os), americium (Am), curium (Cm), berkelium (Bk), or californium (Cf). The electrode 530 may include a metal having a HCP crystal structure.

Figure 6A:
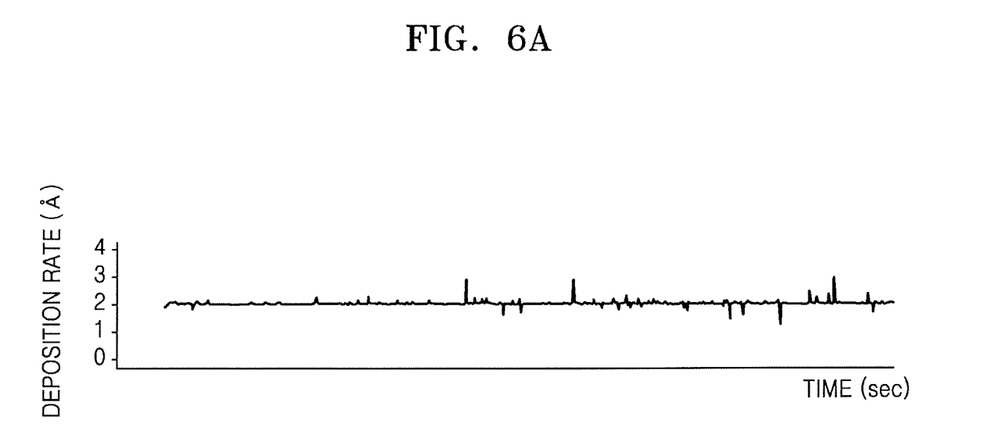
FIG. 6A is a graph illustrating an amount of a deposition material deposited on a QCM sensor according to a Comparative example.
Figure 6B:
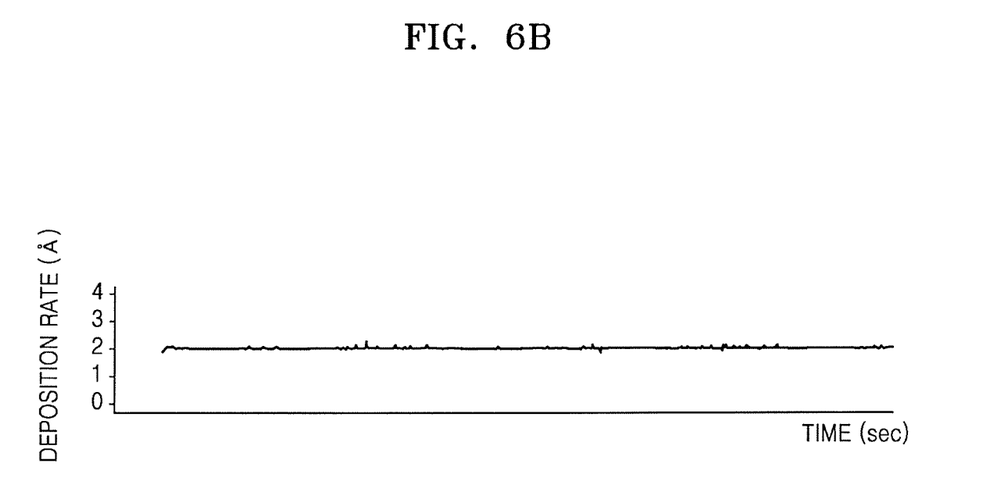
FIG. 6B is a graph illustrating an amount of a deposition material deposited on a QCM sensor according to an exemplary embodiment of the present invention.

FIG. 6A is a graph illustrating an amount of a deposition material deposited on a QCM sensor according to a comparative example. FIG. 6B is a graph illustrating an amount of a deposition material deposited on a QCM sensor according to an exemplary embodiment of the present invention.

The QCM sensor of a comparative example may include gold (Au) as an electrode. Magnesium (Mg) may be deposited on an outer surface of the electrode. The QCM sensor 200 according to an Example of an exemplary embodiment of the present invention may include a buffer layer 220 and an electrode 230. The buffer layer 220 may be disposed on outer surfaces of the crystal plate 210. The electrode 230 may include titanium (Ti). The electrode 230 may be disposed on outer surfaces of the buffer layer 220. Magnesium (Mg) may be deposited on the electrode 230.

Referring to FIG. 6A, according to the comparative example, several peaks having a relatively large variation in height may be present. Thus, according to the comparative example, an amount of magnesium (Mg) deposited on the electrode may be non-uniform according to deposition time. In contrast, referring to FIG. 6B, according to an exemplary embodiment of the present invention, substantially no change in height of peaks is present. Thus, according to the exemplary embodiment of the present invention, an amount of magnesium (Mg) deposited on the electrode 230 may be substantially uniform according to deposition time.

Figure 7A:
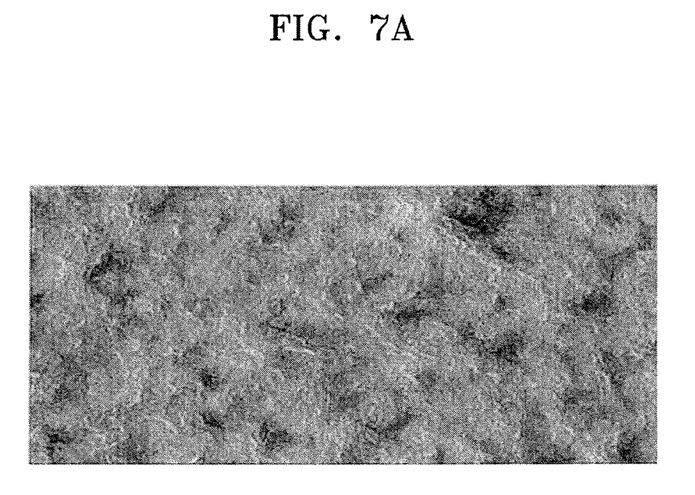
FIG. 7A is a transmission electron microscope (TEM) image illustrating a deposition material deposited on a QCM sensor according to a Comparative Example.
Figure 7B:
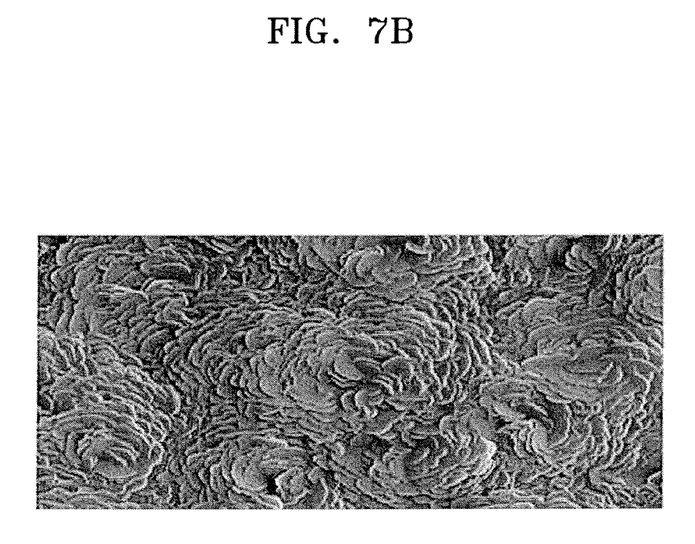
FIG. 7B is a TEM image illustrating a deposition material deposited on a QCM sensor according to an exemplary embodiment of the present invention.

FIG. 7A is a transmission electron microscope (TEM) image illustrating a deposition material deposited on a QCM sensor according to a comparative example. FIG. 7B is a TEM image of a deposition material deposited on a QCM sensor according to an exemplary embodiment of the present invention.

Referring to FIG. 7A, according to the comparative example, seeds may be generated in a partial region of deposited magnesium (Mg). In addition, a grain size of magnesium (Mg) is relatively smaller than a grain size of magnesium (Mg) according to the exemplary embodiment of FIG. 7B, and a crystal is grown in a horizontal direction from a seed position.

In contrast, referring to FIG. 7B, according to an exemplary embodiment of the present invention, seeds may be substantially uniformly generated in a plurality of regions of magnesium (Mg). In addition, a grain size of magnesium (Mg) is relatively larger than a grain size of magnesium (Mg) according to the comparative example of FIG. 7A. Further, a crystal is grown in a vertical direction from a seed position. Accordingly, the QCM sensor 200 according to the exemplary embodiment of the present invention may have a relatively more stable sensing performance compared to the QCM sensor according to the comparative example.

Figure 8:
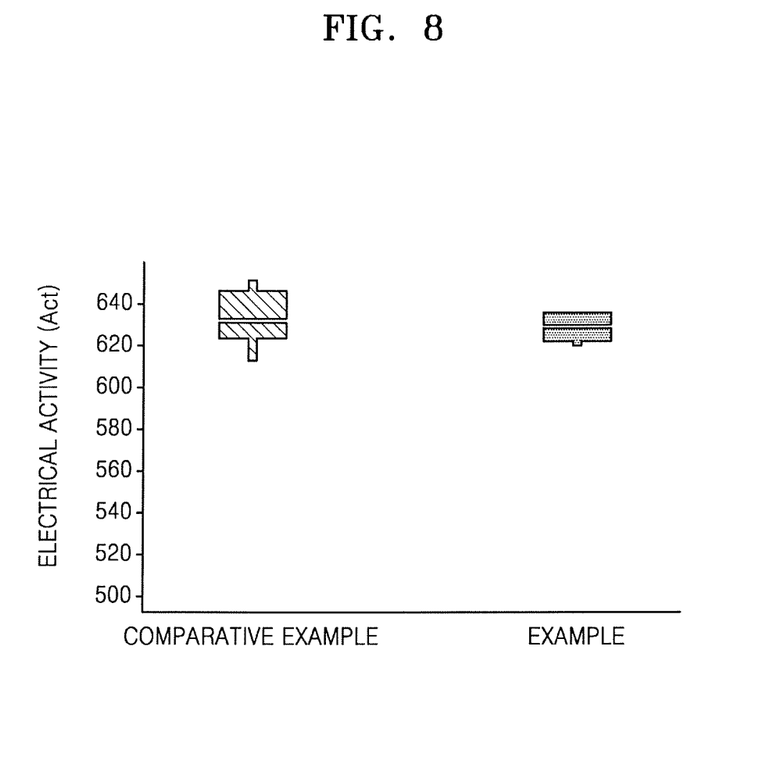
FIG. 8 is a graph illustrating electrical activities according to a comparative example and an exemplary embodiment of the present invention.

FIG. 8 is a graph illustrating electrical activities according to a comparative example and an exemplary embodiment of the present invention.

The electrical activity (Act) indicates a relative value of a deposition material. A deposition material having a relatively high electrical activity may have a relatively small resistance. A deposition material having a relatively low electrical activity may have a relatively large resistance.

Referring to FIG. 8, electrical activity of gold (Au), which is the electrode of the QCM sensor of the comparative example, may be about 634.021. In the QCM sensor 200 according to the exemplary embodiment of the present invention, the buffer layer 220 may include aluminum (Al) having a higher electrical activity than an electrical activity of titanium (Ti) included in the electrode 230. The buffer layer 220 may be disposed below the electrode 230. As a result, electrical activity of the QCM sensor 200 may be improved. The electrical activity of the structure of the QCM sensor 200 of the exemplary embodiment of the present invention, in which the buffer layer 220 and the electrode 230 are stacked, may be about 626.5. Thus, the electrical activity of the QCM sensor 200 according to the exemplary embodiment of the present invention does not differ greatly from the electrical activity of the QCM sensor of the comparative example. Thus, the QCM sensor 200 according to the exemplary embodiment of the present invention may improve the electrical activity and the sensing performance thereof.

The QCM sensor may perform a pre-coating of a deposition material on an outer surface thereof before deposition. As a result, deposition efficiency may be improved.

Table 1 shows data during the pre-coating of the QCM sensors according to the comparative example and the exemplary embodiment of the present invention.

TABLE 1

|  | Pre-coating rate (Å/sec) | Pre-coating time (sec) | Total waiting time (h) during pre-coating | Sensor replacement/recovery time (min) |
| --- | --- | --- | --- | --- |
| Comparative Example | 10 | 600 | 7 | 15 to 20 |
| Example | 4 | 150 | 4 | 2 to 5 |

The total waiting time during pre-coating may be a total waiting time for ten QCM sensors used during the deposition process. The sensor replacement/recovery time may be a time for operation when one sensor being used is replaced with another sensor.

Referring to Table 1, in the comparative example, the pre-coating rate may be 10 Å/sec, the pre-coating time may be about 600 seconds, the total waiting time during pre-coating may be about 7 hours, and the sensor recovery time may be about 15 minutes to about 20 minutes.

In contrast, according to the exemplary embodiment of the present invention, the pre-coating rate may be about 4 Å/sec, the pre-coating time may be about 150 seconds. The total waiting time during pre-coating may be about 4 hours, and the sensor recovery time may be about 2 minutes to about 5 minutes.

Accordingly, the QCM sensor 200 according to the exemplary embodiment of the present invention including the buffer layer 220 and the electrode 230 including titanium (Ti), may reduce the pre-coating rate and the waiting time, as compared with the QCM sensor of the comparative example including the electrode including gold (Au).

According to an exemplary embodiment of the present invention, since the QCM sensor for deposition may measure an amount of a deposition material deposited on a substrate in real time, a deposition film having a substantially uniform thickness on a substrate may be provided.

While one or more exemplary embodiments of the present invention have been described with reference to the figures, it will be understood by those of ordinary skill in the art that various changes in form and details may be made therein without departing from the spirit and scope of the present invention as defined by the following claims.

What is claimed is:

1. A quartz crystal microbalance (QCM) sensor, comprising:
   a crystal plate having a first surface and a second surface opposite the first surface;
   a buffer layer comprising a first buffer layer and a second buffer layer, wherein the first buffer layer is disposed on the first surface of the crystal plate, and the second buffer layer is disposed on the second surface of the crystal plate;

a first adhesive layer is disposed on the first surface of the crystal late;

a second adhesive layer is disposed on second surface of the crystal plate; and an electrode comprising a first electrode and a second electrode, wherein the first electrode is disposed on the first buffer layer, and the second electrode is disposed on the second buffer layer, wherein the electrode comprises at least one of titanium, scandium, beryllium, cobalt, yttrium, zirconium, technetium, ruthenium, lanthanum, cerium, praseodymium, neodymium, gadolinium, terbium, dysprosium, holmium, erbium, thulium, lutetium, hafnium, rhenium, osmium, americium, curium, berkelium, or californium.

2. The QCM sensor of claim 1, wherein the electrode comprises a metal having a hexagonal close-packed lattice (HCP) crystal structure.

3. The QCM sensor of claim 1, wherein
the electrode is disposed on an outermost surface of the QCM sensor.

4. The QCM sensor of claim 1, wherein
the buffer layer comprises aluminum, silver, or gold.

5. The QCM sensor of claim 1, wherein an electrical activity of the buffer layer is higher than an electrical activity of the electrode.

6. The QCM sensor of claim 1, wherein
the first buffer layer is in direct contact with the first surface of the crystal plate, and the second buffer layer is in direct contact with the second surface of the crystal plate, and the first electrode is in direct contact with outer surfaces of the first buffer layer, and
the second electrode is in direct contact with outer surfaces of the second buffer layer.

7. The QCM sensor of claim 1, wherein
the first adhesive layer is disposed on the first surface of the crystal plate, and
the second adhesive layer is disposed on the second surface of the crystal plate,
the first buffer layer is disposed on the first adhesive layer, and
the second buffer layer is disposed on the second adhesive layer, and
the first electrode is disposed on the first buffer layer, and
the second electrode is disposed on the second buffer layer.

8. The QCM sensor of claim 1, wherein
the first buffer layer is disposed on the first surface of the crystal plate, and
the second buffer layer is disposed on the second surface of the crystal plate,
the first adhesive layer is disposed on the first buffer layer, and
the second adhesive layer is disposed on the second buffer layer, and
the first electrode is disposed on the first buffer layer, and
the second electrode is disposed on the second buffer layer.

9. The QCM sensor of claim 1, wherein
the first adhesive layer is disposed on the first surface of the crystal plate, and
the second adhesive layer is disposed on the second surface of the crystal plate,
the first buffer layer is disposed on the first adhesive layer, and
the second buffer layer is disposed on the second adhesive layer,
a third adhesive layer is disposed on the first buffer layer, and
a fourth adhesive layer is disposed on the second buffer layer, and
the first electrode is disposed on the third adhesive layer, and
the second electrode is disposed on the fourth adhesive layer.

10. The QCM sensor of claim 1, wherein the first and second adhesive layers comprise a metal having a hexagonal close-packed lattice (HCP) crystal structure.

11. A quartz crystal microbalance (QCM) sensor, comprising:
a crystal plate having a first surface and a second surface opposite the first surface;
a buffer layer comprising a first buffer layer and a second buffer layer, wherein the first buffer layer is disposed on the first surface of the crystal plate, and the second buffer layer is disposed on the second surface of the crystal plate, wherein the buffer layer is formed of gold;
a first adhesive layer is disposed on the first surface of the crystal plate;
a second adhesive layer is disposed on second surface of the crystal plate; and
an electrode comprising a first electrode and a second electrode, wherein the first electrode is disposed on the first buffer layer, and the second electrode is disposed on the second buffer layer,
wherein the electrode comprises a metal having a hexagonal close-packed lattice (HCP) crystal structure.

12. The QCM sensor of claim 11, wherein the electrode comprises at least one of titanium, scandium, beryllium, cobalt, yttrium, zirconium, technetium, ruthenium, lanthanum, cerium, praseodymium, neodymium, gadolinium, terbium, dysprosium, holmium, erbium, thulium, lutetium, hafnium, rhenium, osmium, americium, curium, berkelium, or californium.

13. The QCM sensor of claim 12, wherein
the electrode is disposed on an outermost surface of the QCM sensor.

14. The QCM sensor of claim 11,
wherein the first and second adhesive layers comprise a metal having a HCP crystal structure.

* * * * *